(12) United States Patent
Yuan et al.

(10) Patent No.: US 10,851,455 B2
(45) Date of Patent: Dec. 1, 2020

(54) SILICON-NITRIDE-CONTAINING THERMAL CHEMICAL VAPOR DEPOSITION COATING

(71) Applicant: SILCOTEK CORP., Bellefonte, PA (US)

(72) Inventors: Min Yuan, State College, PA (US); James B. Mattzela, Port Matilda, PA (US); David A. Smith, Bellefonte, PA (US)

(73) Assignee: SilcoTek Corp., Bellefonte, PA (US)

( * ) Notice: Subject to any disclaimer, the term of this patent is extended or adjusted under 35 U.S.C. 154(b) by 0 days.

(21) Appl. No.: 16/121,994

(22) Filed: Sep. 5, 2018

(65) Prior Publication Data

US 2019/0003044 A1 Jan. 3, 2019

Related U.S. Application Data

(62) Division of application No. 14/970,015, filed on Dec. 15, 2015, now Pat. No. 10,087,521.

(51) Int. Cl.
| | |
|---|---|
| C23C 16/00 | (2006.01) |
| C23C 16/34 | (2006.01) |
| C23C 16/04 | (2006.01) |
| C23C 16/455 | (2006.01) |
| C23C 16/30 | (2006.01) |
| C23C 16/56 | (2006.01) |

(52) U.S. Cl.
CPC ......... *C23C 16/345* (2013.01); *C23C 16/045* (2013.01); *C23C 16/308* (2013.01); *C23C 16/45523* (2013.01); *C23C 16/45557* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 3,637,423 A * | 1/1972 | Sestrich | C23C 16/345 427/113 |
| 4,319,803 A * | 3/1982 | Burmeister | G02B 6/4402 385/128 |
| 4,402,997 A | 9/1983 | Hogan et al. | |
| 4,741,925 A * | 5/1988 | Chaudhuri | C23C 16/46 118/730 |
| 5,208,069 A | 5/1993 | Clark et al. | |
| 5,413,813 A * | 5/1995 | Cruse | C07F 7/21 427/237 |

(Continued)

*Primary Examiner* — Robert S Loewe
(74) *Attorney, Agent, or Firm* — Saxton & Stump LLC

(57) ABSTRACT

Surfaces, articles, and processes having silicon-nitride-containing thermal chemical vapor deposition coating are disclosed. A process includes producing a silicon-nitride-containing thermal chemical vapor deposition coating on a surface within a chamber. Flow into and from the chamber is restricted or halted during the producing of the silicon-nitride-containing thermal chemical vapor deposition coating on the surface. A surface includes a silicon-nitride-containing thermal chemical vapor deposition coating. The surface has at least a concealed portion that is obstructed from view. An article includes a silicon-nitride-containing thermal chemical vapor deposition coating on a surface within a chamber. The surface has at least a concealed portion that is obstructed from view.

20 Claims, 1 Drawing Sheet

(56) References Cited

U.S. PATENT DOCUMENTS

| | | | |
|---|---|---|---|
| 5,526,984 A * | 6/1996 | Foster | B01J 4/001 |
| | | | 239/423 |
| 5,756,404 A | 5/1998 | Friedenreich et al. | |
| 5,874,368 A * | 2/1999 | Laxman | C23C 16/345 |
| | | | 257/E21.293 |
| 5,897,754 A * | 4/1999 | Fujii | H01J 9/20 |
| | | | 204/192.12 |
| 5,939,333 A | 8/1999 | Hurley et al. | |
| 5,981,403 A | 11/1999 | Ma et al. | |
| 6,416,577 B1 | 7/2002 | Suntoloa et al. | |
| 6,444,326 B1 | 9/2002 | Smith | |
| 6,511,760 B1 | 1/2003 | Barone et al. | |
| 6,531,415 B1 | 3/2003 | Yang et al. | |
| 6,566,281 B1 | 5/2003 | Buchanan et al. | |
| 6,630,413 B2 | 10/2003 | Todd | |
| 6,786,997 B1 * | 9/2004 | Yamazaki | C23C 16/4405 |
| | | | 118/715 |
| 7,052,736 B2 * | 5/2006 | Wei | B05D 1/62 |
| | | | 427/230 |
| 7,070,833 B2 | 7/2006 | Smith et al. | |
| 7,192,626 B2 | 3/2007 | Dussarrat et al. | |
| 7,510,935 B2 | 3/2009 | Lee et al. | |
| 7,875,556 B2 | 1/2011 | Xiao et al. | |
| 8,357,430 B2 | 1/2013 | Dussarrat et al. | |
| 8,563,445 B2 * | 10/2013 | Liang | C23C 16/345 |
| | | | 257/E21.24 |
| 8,980,382 B2 | 3/2015 | Ingle et al. | |
| 2002/0076501 A1 * | 6/2002 | Costantini | B29C 33/58 |
| | | | 427/133 |
| 2004/0115377 A1 * | 6/2004 | Wei | B05D 1/62 |
| | | | 428/34.1 |
| 2006/0099359 A1 * | 5/2006 | Hiss | C23C 16/045 |
| | | | 428/34.4 |
| 2007/0074777 A1 * | 4/2007 | Takahashi | F01N 13/08 |
| | | | 138/140 |
| 2010/0004110 A1 * | 1/2010 | Barker | C03B 19/1005 |
| | | | 501/21 |

* cited by examiner

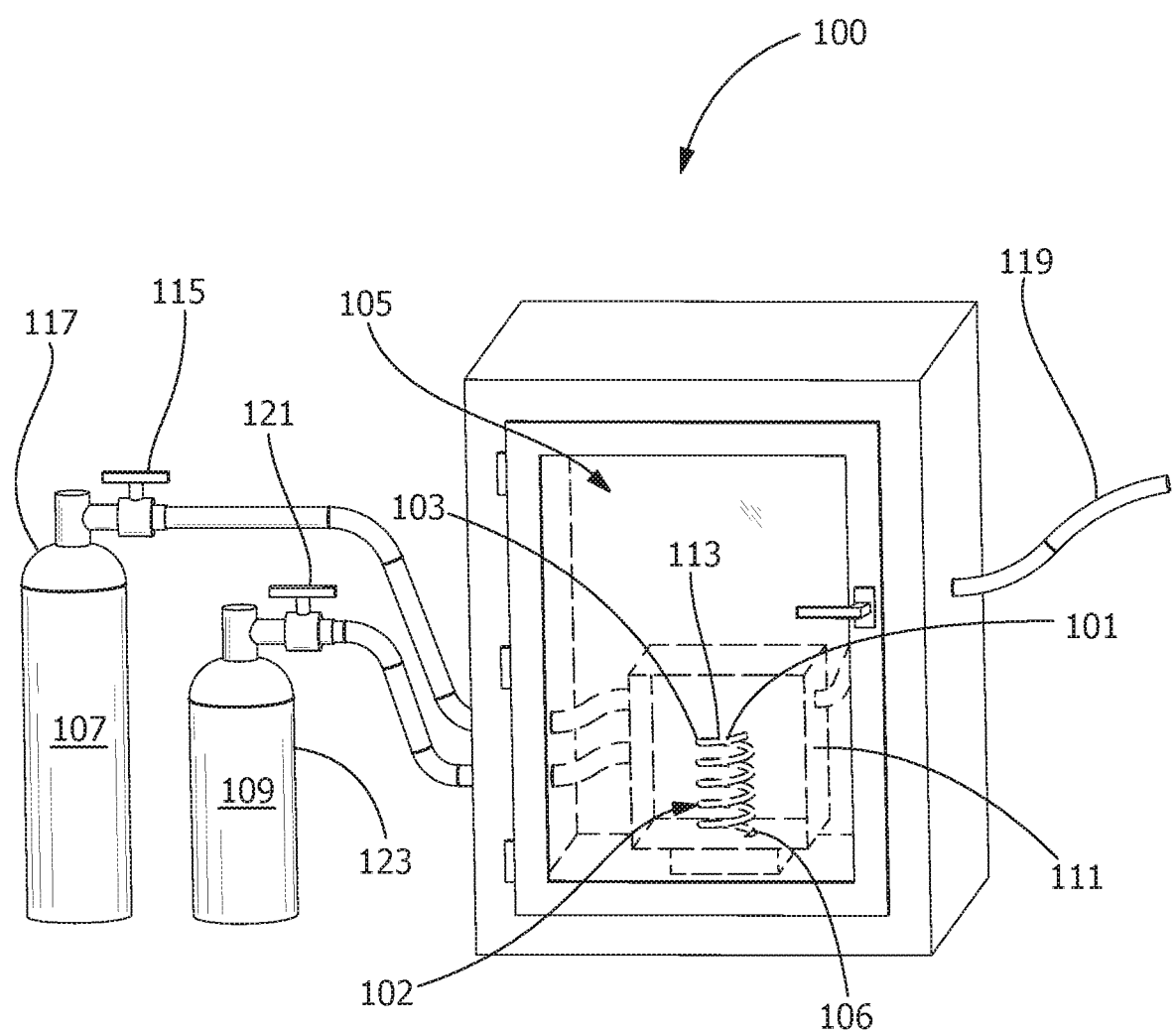

SILICON-NITRIDE-CONTAINING THERMAL CHEMICAL VAPOR DEPOSITION COATING

PRIORITY

The present application is a divisional patent application claiming priority to U.S. patent application Ser. No. 14/970,015, titled SILICON-NITRIDE-CONTAINING THERMAL CHEMICAL VAPOR DEPOSITION COATING, filed on Dec. 15, 2015, the entirety of which is incorporated by reference.

FIELD OF THE INVENTION

The present invention is directed to silicon-nitride-containing thermal chemical vapor deposition coatings. More particularly, the present invention is directed to surfaces, articles, and processes relating to such coatings.

BACKGROUND OF THE INVENTION

Often, surfaces of substrates do not include desired performance characteristics. The failure to include specific desired performance characteristics can result in surface degradation in certain environments, an inability to meet certain performance requirements, or combinations thereof. For example, in certain environments, metallic, glass, and ceramic surfaces can be subjected to wear and other undesirable surface activities such as chemical adsorption, catalytic activity, corrosive attack, oxidation, by-product accumulation or stiction, and/or other undesirable surface activities.

Undesirable surface activities can cause chemisorption of other molecules, reversible and irreversible physisorption of other molecules, catalytic reactivity with other molecules, attack from foreign species, a molecular breakdown of the surface, physical loss of substrate, or combinations thereof.

To provide certain desired performance characteristics, coatings can be applied to surfaces by various coating deposition techniques to impart better corrosion resistance, improved chemical inertness, better wear resistance, and enhanced anti-stiction properties. Such techniques can include dip coating, spray coating, spin coating, printing, electroplating, and/or physical vapor deposition (PVD). Dip coating, spray coating, spin coating, printing, plating, and PVD can be limited to certain surfaces and/or unable to provide true three-dimensional coating capability. For example, coating of surfaces within tubes can be especially problematic because the coating can build up on the entrance of the tube, the coating can have different thicknesses throughout the tube, and/or the application process may be incapable of applying coating within the tube.

Chemical vapor deposition has been used to produce coatings with improved characteristics by depositing a material at a temperature above the thermal decomposition temperature of the material. However, further improvements are desired.

A surface, article, and process that show one or more improvements in comparison to the prior art would be desirable in the art.

BRIEF DESCRIPTION OF THE INVENTION

In an embodiment, a process includes producing a silicon-nitride-containing thermal chemical vapor deposition coating on a surface within a chamber. Flow into and from the chamber is restricted or halted during the producing of the silicon-nitride-containing thermal chemical vapor deposition coating on the surface.

In another embodiment, a surface includes a silicon-nitride-containing thermal chemical vapor deposition coating. The surface has at least a concealed portion that is obstructed from view.

In another embodiment, an article includes a silicon-nitride-containing thermal chemical vapor deposition coating on a surface within a chamber. The surface has at least a concealed portion that is obstructed from view.

Other features and advantages of the present invention will be apparent from the following more detailed description, taken in conjunction with the accompanying drawing which illustrate, by way of example, the principles of the invention.

BRIEF DESCRIPTION OF THE DRAWINGS

FIG. 1 is a perspective view of a chemical vapor deposition system used in a process, according to an embodiment of the disclosure.

Wherever possible, the same reference numbers will be used throughout the drawings to represent the same parts.

DETAILED DESCRIPTION OF THE INVENTION

Provided are a surface, article, and process having a silicon-nitride-containing thermal chemical vapor deposition (CVD) coating. Embodiments of the present disclosure, for example, in comparison to concepts failing to include one or more of the features disclosed herein, permit improved corrosion resistance, better wear resistance, enhanced chemical inertness, increased anti-stiction properties, and a true three-dimensional coating capability for objects with complex geometries, or permit a combination thereof.

According to an embodiment, the process includes producing a silicon-nitride-containing thermal CVD coating 101 on a surface 103 of an article 102 within an enclosed CVD chamber 105 and/or an enclosed CVD vessel 111 of a CVD system 100. As used herein, the phrase "thermal CVD" refers to thermal application that does not encompass non-thermal energy sources, such as photo, plasma, kinetic, and/or chemical energy-assisted techniques.

In one embodiment, flow into the CVD chamber 104 and through an effluent path 119 from the enclosed CVD chamber 105 and/or the enclosed CVD vessel 111 is restricted or halted during the producing of the silicon-nitride-containing thermal CVD coating 101 on the surface 103, for example, distinguishing the process as a static thermal CVD technique in contrast to flow-through processes used for line-of-sight deposition.

Suitable dimensions for the enclosed CVD chamber 105 and/or the enclosed CVD vessel 111 used in the thermal CVD process include, but are not limited to, having a minimum width of greater than 5 cm, of greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes include, but are not limited to, at least 1,000 $cm^3$, greater than 3,000 $cm^3$, greater than 5,000 $cm^3$, greater than 10,000 $cm^3$, greater than 20,000 cm³, between 3,000 cm³ and 5,000 cm³, between 5,000 cm³ and 10,000 cm³, between 5,000 cm³ and 20,000 cm³, between 10,000 cm³ and 20,000 cm³, any other volumes capable of uniform or substantially uniform heating, or any suitable combination, sub-combination, range, or sub-range therein.

The silicon-nitride-containing thermal CVD coating 101 is produced by introducing one or more suitable nitrogen-containing species 107 and/or silicon-containing species 109 into the enclosed CVD chamber 105 and/or the enclosed CVD vessel 111 positioned within the enclosed CVD chamber 105. Suitable nitrogen-containing species include, but are not limited to, ammonia, nitrogen, hydrazine, any other suitable species, and combinations thereof. Suitable silicon-containing species include, but are not limited to, silane, trisilylamine (also known as, TSA; silanamine; N,N-disilyl-disilazane; 2-silyl-; silane, nitrilotris; or 3SA), Bis(tertiary-butylamino)silane, 1,2-bis(dimethylamino)tetramethyldisilane, dichlorosilane, hexachlorodisilane, any other suitable species, and combinations thereof. In embodiments with more than one species being introduced, the species are introduced concurrently or sequentially (with either species being introduced first).

In one embodiment, the introducing of the species results in the silicon-nitride-containing thermal CVD coating 101 including pure or substantially pure silicon nitride, silicon nitride oxide, one or more functionalized layers, or a combination thereof. As used herein, the term "functionalized" and grammatical variations thereof refer to bonding of a terminated group with the surface.

In further embodiments, one or more additional silicon-nitride-containing thermal CVD coatings 113 are included. Such additional silicon-nitride-containing thermal CVD coatings 113 have a thickness that is greater than, less than, or substantially equal to that of the silicon-nitride-containing thermal CVD coating 101, for example, being at least 100 nm, 200 nm, between 50 nm and 500 nm, or any suitable combination, sub-combination, range, or sub-range therein. The additional silicon-nitride-containing thermal CVD coating(s) 113 are capable of having any of the properties or features described herein with reference to the silicon-nitride-containing thermal CVD coating 101.

The thermal CVD is performed under any suitable conditions permitting the formation of the desired properties, such as, increased compaction/density. Suitable temperature ranges include, but are not limited to, between 100° C. and 700° C., between 100° C. and 450° C., between 100° C. and 300° C., between 200° C. and 500° C., between 300° C. and 600° C., between 325° C. and 600° C., between 450° C. and 600° C., between 550° C. and 600° C., between 450° C. and 700° C., 700° C., 450° C., 100° C., between 200° C. and 600° C., between 300° C. and 600° C., between 400° C. and 500° C., 300° C., 400° C., 500° C., 600° C., or any suitable combination, sub-combination, range, or sub-range thereof.

Suitable pressures ranges include, but are not limited to, between 0.01 psia and 200 psia, between 1.0 psia and 100 psia, between 5 psia and 40 psia, between 20 psia and 25 psia, greater than 25 psia, greater than 20 psia, less than 20 psia, less than 15 psia, 1.0 psia, 5 psia, 20 psia, 23 psia, 25 psia, 40 psia, 100 psia, 200 psia, or any suitable combination, sub-combination, range, or sub-range therein.

To achieve the desired pressures, in one embodiment, the introducing of the nitrogen-containing species 107 (for example, ammonia) includes opening a first flow control device 115 connected to a first vessel 117 (for example, a cylinder) containing the nitrogen-containing species 107, while the enclosed CVD chamber 105 and/or the enclosed CVD vessel 111 is at a first selected pressure (for example, between 0.0001 psia and 10 psia) and closing and/or restricting flow in the first flow control device 115 when the pressure within the enclosed CVD chamber 105 and/or the enclosed CVD vessel 111 is at a second selected pressure (for example, between 0.01 psia and 50 psia).

In one embodiment, the sequence of the introducing of the nitrogen-containing species 107 and/or the silicon-containing species 109 is repeated, for example, iteratively, to achieve a desired ratio of silicon to nitrogen within the CVD coating 101. Additionally or alternatively, in one embodiment, the nitrogen-containing species 107 and the silicon-containing species 109 are introduced concurrently, for example, by employing a parallel-fill approach, a pre-mixing approach (such as a configuration that includes mixing precursors in a predetermined ratio before introducing to the CVD vessel 111), or a combination thereof.

Additionally or alternatively, in another embodiment, the introducing of the silicon-containing species 109 (for example, the trisilylamine) includes opening a second flow control device 121 connected to a second vessel 123 (for example, a cylinder) containing the silicon-containing species 109, while the enclosed CVD chamber 105 and/or the enclosed CVD vessel 111 is at a third selected pressure (for example, between 0.01 psia and 10 psia) and closing and/or restricting flow in the second flow control device 121 when the pressure within the enclosed CVD chamber 105 and/or the enclosed CVD vessel 111 is at a fourth selected pressure (for example, between 0.01 psia and 50 psia).

Suitable duration periods (for example, after the initiation, after the completion, or between the initiation and completion of the introducing, but before permitting or facilitating evacuation of the CVD chamber 105) permit the formation of the desired properties of the CVD coating 101. Such suitable duration periods include, but are not limited to, between 10 minutes and 24 hours, between 1 hours and 10 hours, between 2 hours and 10 hours, between 4 hours and 6 hours, between 4 hours and 8 hours, at least 10 minutes, at least 1 hours, at least 4 hours, at least 10 hours, less than 10 hours, less than 8 hours, less than 6 hours, less than 4 hours, or any suitable combination, sub-combination, range, or sub-range therein.

In one embodiment, the silicon-nitride-containing thermal CVD coating 101 is or includes an oxidized coating produced by oxidizing under suitable conditions. Suitable conditions include, but are not limited to, exposure to any suitable chemical species capable of donating a reactive oxygen species into the coating under predetermined oxidation conditions. In general, oxidation is a bulk reaction that affects the bulk of the coating. Suitable chemical species for the oxidation include, for example, water, oxygen, air, nitrous oxide, ozone, peroxide, and combinations thereof. In one embodiment, the oxidation is with water as an oxidizing agent (for example, within a temperature range of 100° C. to 600° C., a temperature range of 300° C. to 600° C., or at a temperature of 325° C. or 450° C.). In one embodiment, the oxidation is with air and water (for example, within a temperature range of 100° C. to 600° C., a temperature range of 300° C. to 600° C., or at a temperature of 325° C. or 450° C.). In one embodiment, the oxidizing is only with air (for example, within a temperature range of 100° C. to 600° C., a temperature range of 300° C. to 600° C., or at a temperature of 325° C. or 450° C.). In one embodiment, the oxidizing is with nitrous oxide ($N_2O$). Specifically, $N_2O$ is applied under heat (for example, about 325° C. or 450° C.) with a pressure of substantially pure $N_2O$ in a vessel with carbosilane-coated samples.

Such materials may be applied iteratively and/or with purges in between, for example, with an inert gas (such as, nitrogen, helium, and/or argon, as a partial pressure dilutant). The thickness of such materials is between 100 nm and 10,000 nm, between 100 nm and 5,000 nm, between 200 nm and 5,000 nm, between 100 nm and 3,000 nm, between 300 nm and 1,500 nm, or any combination, sub-combination, range, or sub-range thereof.

Additionally, in further embodiments, the surface 103 is treated. Suitable treatments include, but are not limited to, exposure to water (alone, with zero air, or with an inert gas), oxygen (for example, at a concentration, by weight, of at least 50%), air (for example, alone, not alone, and/or as zero air), nitrous oxide, ozone, peroxide, or a combination thereof. As used herein, the term "zero air" refers to atmospheric air having less than 0.1 ppm total hydrocarbons. The term "air" generally refers to a gaseous fluid, by weight, of mostly nitrogen, with the oxygen being the second highest concentration species within. For example, in one embodiment, the nitrogen is present at a concentration, by weight, of at least 70% (for example, between 75% and 76%) and oxygen is present at a concentration, by weight, of at least 20% (for example, between 23% and 24%).

In further embodiments, the thermal CVD process includes any suitable additional steps. Suitable additional steps include, but are not limited to, cleaning, purging, pre-deposition treatment (for example, heating of the substrate and/or cold-fill), and/or oxidizing (for example, by introducing an oxidizer).

The purging of the thermal CVD process evacuates or substantially evacuates gas(es) from the enclosed CVD chamber 105 and/or the enclosed CVD vessel 111. In general, any portion of the thermal CVD process is capable of being preceded or followed by selectively applying a purge gas to the enclosed CVD chamber 105 and/or the enclosed CVD vessel 111. The purge gas is nitrogen, helium, argon, or any other suitable inert gas. The purging is in one purge cycle, two purge cycles, three purge cycles, more than three purge cycles, or any suitable number of purge cycles that permits the enclosed CVD chamber 105 and/or the enclosed CVD vessel 111 to be a chemically inert environment.

The cleaning of the thermal CVD process removes undesirable materials from the surface 103. In general, any portion of the CVD process is capable of being preceded or followed by the cleaning.

In one embodiment, the pre-deposition treatment, the functionalizing, or a combination thereof include(s) cold-fill operation. For example, in a further embodiment, the cold fill operation during the pre-deposition treatment includes introduction of the decomposition gas at a sub-decomposition temperature that is below the thermal decomposition temperature of the decomposition gas. As used herein, the phrase "sub-decomposition temperature" refers to conditions at which the decomposition gas will not appreciably thermally decompose. Depending upon the species utilized, suitable cold-fill operation temperatures include, but are not limited to, less than 30° C., less than 60° C., less than 100° C., less than 150° C., less than 200° C., less than 250° C., less than 300° C., less than 350° C., less than 400° C., less than 440° C., less than 450° C., between 100° C. and 300° C., between 125° C. and 275° C., between 200° C. and 300° C., between 230° C. and 270° C., or any suitable combination, sub-combination, range, or sub-range therein.

During and/or after the introducing of the decomposition gas, the operating of the enclosed CVD chamber 105 and/or the enclosed CVD vessel 111 includes heating to a super-decomposition temperature that is equal to or above the thermal decomposition temperature of the decomposition gas. As used herein, the phrase "super-decomposition temperature" refers to conditions at which the decomposition gas will appreciably thermally decompose. The heating of the enclosed CVD chamber 105 and/or the enclosed CVD vessel 111 is at any suitable heating rate from the sub-decomposition temperature to the super-decomposition temperature.

In one embodiment, the article 102 receiving the silicon-nitride-containing thermal CVD coating 101 is or includes, but is not limited to, a tube (for example, an interior and/or exterior surface), a planar geometry structure, a non-planar geometry structure, a complex geometry structure, a metallic structure, a metal structure, and/or a ceramic structure. In one embodiment, the article 102 include the silicon-nitride-containing thermal CVD coating 101 being on a concealed portion 106 that is obstructed from view (for example, the portion not being capable of receiving a coating via line-of-sight techniques).

Specific embodiments include the article 102 being one or more of fittings (for example, unions, connectors, adaptors, other connections between two or more pieces of tubing, for example, capable of having a leak-free or substantially leak-free seal), threaded fittings (for example, ferrules, such as, a front and back ferrule), tubing (for example, coiled tubing that is loose or bound, such as, in a metal spool, assembled and sealed with a waterproof jacket, pre-bent, straight, and/or flexible), valves (for example, having a rupture disc, rotor, multi-position configuration, pressure rating of greater than 5,000 psia, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including o-rings, seals, and/or diaphragms), injection ports (for example, for gas chromatographs), in-line filters (for example, having springs, wrench flats, mesh screens, and/or weldments), glass liners, gas chromatograph components, sample probes, control probes (for example, having a box, a suck tube, a suck filter, and/or a dilution box), downhole sampling containers, or a combination thereof.

The article 102 is capable of being a forged structure, a molded structure, an additively-produced structure, or any other suitable structure. In one embodiment, the surface 103 is or includes a stainless steel surface (martensitic or austenitic), a nickel-based alloy, a metal surface, a metallic surface (ferrous or non-ferrous; tempered or non-tempered; and/or equiaxed, directionally-solidified, or single crystal), a ceramic surface, a ceramic matrix composite surface, a glass surface, ceramic matrix composite surface, a composite metal surface, a coated surface, a fiber surface, a foil surface, a film, a polymeric surface (such as, polyether etherketone), and/or any other suitable surface capable of withstanding operational conditions of the thermal CVD process. In further embodiments, the structure has a concentration, by weight, of between 26% and 34% Cu and/or between 50% and 67% Ni.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. An article, comprising:
a silicon-nitride-containing coating on a surface;
wherein the surface has at least one concealed portion that is obstructed from view;
wherein the surface includes an interior surface and an exterior surface, the interior surface and the exterior surface having the silicon-nitride-containing coating.

2. The article of claim 1, wherein the silicon-nitride-containing coating includes silicon nitride oxide.

3. The article of claim 1, wherein the silicon-nitride-containing coating includes a functionalized layer.

4. The article of claim 1, further comprising an additional silicon-nitride-containing coating, the additional silicon nitride coating having a smaller thickness than the silicon-nitride-containing coating.

5. The article of claim 1, further comprising an additional silicon-nitride-containing coating, the additional silicon nitride coating having a greater thickness than the silicon-nitride-containing coating.

6. The article of claim 1, further comprising an additional silicon-nitride-containing coating, the additional silicon nitride coating having a thickness of between 50 nm and 500 nm.

7. The article of claim 1, wherein the article includes an oxidized layer.

8. The article of claim 1, wherein the article is a non-planar structure.

9. The article of claim 1, wherein the article is a complex geometry structure.

10. The article of claim 1, wherein the article is a metallic structure.

11. The article of claim 1, wherein the article is a metal structure.

12. The article of claim 1, wherein the article is a ceramic structure.

13. The article of claim 1, wherein the article is a union, a connector, an adaptor, a ferrule, a valve, a spring, a regulator, a flow-controller, an injection port, a sample probe, or a combination thereof.

14. The article of claim 1, wherein the article is a sample cylinder.

15. The article of claim 1, wherein the article is an in-line filter.

16. The article of claim 1, wherein the article is a spool.

17. The article of claim 1, wherein the article is a structure with only one opening.

18. The article of claim 1, wherein the article is a forged structure, a molded structure, or an additively-produced structure.

19. An article, comprising:
a silicon-nitride-containing coating on a surface of the article;
wherein the surface has at least a concealed portion that is obstructed from view;
wherein the article includes an oxidized layer;
wherein the oxidized layer has a thickness of between 100 nm and 10,000 nm.

20. An article, comprising:
a silicon-nitride-containing coating on an interior surface and an exterior surface of the article,
wherein the article is a tube.

* * * * *